United States Patent
Xiao et al.

(10) Patent No.: US 10,923,399 B2
(45) Date of Patent: *Feb. 16, 2021

(54) HYBRID INTEGRATED SEMICONDUCTOR TRI-GATE AND SPLIT DUAL-GATE FINFET DEVICES AND METHOD FOR MANUFACTURING

(71) Applicant: SEMICONDUCTOR MANUFACTURING INTERNATIONAL (SHANGHAI) CORPORATION, Shanghai (CN)

(72) Inventors: Deyuan Xiao, Shanghai (CN); Guo Qing Chen, Shanghai (CN); Roger Lee, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 6 days.

This patent is subject to a terminal disclaimer.

(21) Appl. No.: 15/885,564

(22) Filed: Jan. 31, 2018

(65) Prior Publication Data

US 2018/0174909 A1    Jun. 21, 2018

Related U.S. Application Data

(60) Division of application No. 13/711,586, filed on Dec. 11, 2012, now Pat. No. 9,922,878, which is a
(Continued)

(30) Foreign Application Priority Data

Jan. 8, 2010 (CN) .......................... 2010 1 0022579

(51) Int. Cl.
*H01L 21/782* (2006.01)
*H01L 21/84* (2006.01)
(Continued)

(52) U.S. Cl.
CPC .......... *H01L 21/782* (2013.01); *H01L 21/845* (2013.01); *H01L 27/1211* (2013.01); *H01L 29/7855* (2013.01)

(58) Field of Classification Search
CPC ....................................................... H01L 21/44
See application file for complete search history.

(56) References Cited

U.S. PATENT DOCUMENTS

| 4,992,838 A | 2/1991 | Mori |
| 7,244,666 B2 * | 7/2007 | Jin .......................... H01L 21/845 257/74 |

(Continued)

FOREIGN PATENT DOCUMENTS

| CN | 1581431 | 2/2005 |
| CN | 1753156 | 3/2006 |
| CN | 101060136 | 10/2007 |

OTHER PUBLICATIONS

Zaman et al., Mater. Res. Sump. Proc. 872, J3.11.1-5, 2005.*
(Continued)

*Primary Examiner* — Kenneth Parker
*Assistant Examiner* — Christopher A Culbert
(74) *Attorney, Agent, or Firm* — Anova Law Group, PLLC

(57) ABSTRACT

A method for making a tri-gate FinFET and a dual-gate FinFET includes providing a semiconductor on insulator (SOI) wafer having a semiconductor layer over an insulator layer. The method further includes forming a hard mask on the semiconductor layer and patterning the hard mask to form first and second cap portions. The method also includes etching the semiconductor layer to form first and second fins using the first and second cap portions as an etch mask. The method also includes removing the second cap portion to expose the top surface of the second fin and forming a gate dielectric layer on the first and second fins. The method
(Continued)

further includes forming a conductive layer over the gate dielectric layer, selectively etching the conductive layer to form first and second gate structures, forming an interlayer dielectric layer over the gate structures, and planarizing the interlayer dielectric layer using the first cap portion as a polish stop.

20 Claims, 13 Drawing Sheets

Related U.S. Application Data continuation-in-part of application No. 12/986,130, filed on Jan. 6, 2011, now Pat. No. 9,202,762.

(51) Int. Cl.
  *H01L 27/12* (2006.01)
  *H01L 29/78* (2006.01)

(56) References Cited

U.S. PATENT DOCUMENTS

| | | | |
|---|---|---|---|
| 7,256,455 B2* | 8/2007 | Ahmed | H01L 29/42384 257/347 |
| 7,525,160 B2 | 4/2009 | Kavalieros et al. | |
| 9,202,762 B2 | 12/2015 | Xiao et al. | |
| 2003/0139065 A1 | 7/2003 | Han | |
| 2004/0075121 A1 | 4/2004 | Yu et al. | |
| 2005/0077574 A1 | 4/2005 | Mouli | |
| 2006/0068550 A1 | 3/2006 | Chang et al. | |
| 2006/0128131 A1* | 6/2006 | Chang | H01L 21/845 438/599 |
| 2006/0141706 A1* | 6/2006 | Hong | H01L 27/115 438/257 |
| 2006/0202266 A1* | 9/2006 | Radosavljevic | H01L 23/485 257/344 |
| 2007/0075351 A1* | 4/2007 | Schulz | H01L 21/823821 257/314 |
| 2007/0132009 A1* | 6/2007 | Takeuchi | H01L 21/845 257/321 |
| 2008/0050882 A1* | 2/2008 | Bevan | H01L 21/28167 438/308 |
| 2008/0194091 A1 | 8/2008 | Lin et al. | |
| 2009/0017589 A1 | 1/2009 | Ban et al. | |
| 2009/0152634 A1 | 6/2009 | Grant | |
| 2009/0325350 A1 | 12/2009 | Radosavljevic et al. | |
| 2012/0032732 A1 | 2/2012 | Xiao et al. | |
| 2013/0102116 A1 | 4/2013 | Xiao et al. | |

OTHER PUBLICATIONS

U.S. Appl. No. 12/986,130, Final Office Action dated Jan. 8, 2014, 20 pages.
U.S. Appl. No. 12/986,130, Non-Final Office Action dated Jul. 16, 2013, 12 pages.
U.S. Appl. No. 12/986,130, Non-Final Office Action dated Jan. 15, 2015, 22 pages.
U.S. Appl. No. 12/986,130, Notice of Allowance dated Jul. 31, 2015, 9 pages.
U.S. Appl. No. 12/986,130, Restriction Requirement dated Jan. 7, 2013, 7 pages.
U.S. Appl. No. 13/711,586, Corrected Notice of Allowability dated Dec. 28, 2017, 4 pages.
U.S. Appl. No. 13/711,586, Final Office Action dated Nov. 28, 2014, 11 pages.
U.S. Appl. No. 13/711,586, Final Office Action dated Jan. 29, 2016, 15 pages.
U.S. Appl. No. 13/711,586, Final Office Action dated Jun. 23, 2017, 15 pages.
U.S. Appl. No. 13/711,586, Non-Final Office Action dated Jan. 17, 2017, 12 pages.
U.S. Appl. No. 13/711,586, Non-Final Office Action dated May 8, 2014, 12 pages.
U.S. Appl. No. 13/711,586, Non-Final Office Action dated May 7, 2015, 14 pages.
U.S. Appl. No. 13/711,586, Notice of Allowance dated Nov. 8, 2017, 9 pages.
U.S. Appl. No. 13/711,586, Restriction Requirement dated Dec. 18, 2013, 6 pages.
Al-Shareef et al., Device Performance of in Situ Steam Generated Gate Dielectric Nitrided by Remote Plasma Nitridation, Appl. Phys. Lett., vol. 78, No. 24, Jun. 11, 2001, pp. 3875-3877.
Zaman et al., Effects of Hydrogen Annealing Process Conditions on Nano Scale Silicon (011) Fins, Mater. Res. Symp. Proc., vol. 872, Jan. 2005, pp. J3.1.1-J3.1.5.

* cited by examiner

HYBRID INTEGRATED SEMICONDUCTOR TRI-GATE AND SPLIT DUAL-GATE FINFET DEVICES AND METHOD FOR MANUFACTURING

CROSS-REFERENCES TO RELATED APPLICATIONS

This application is a divisional of U.S. application Ser. No. 13/711,586, filed Dec. 11, 2012, which is a continuation-in-part of U.S. application Ser. No. 12/986,130, filed Jan. 6, 2011, now U.S. Pat. No. 9,202,762, issued on Dec. 1, 2015, which is commonly assigned, and which claims the benefit of priority from Chinese Patent Application No. 201010022579.3, filed Jan. 8, 2010. The full disclosure of each of these applications is incorporated herein by reference.

BACKGROUND OF THE INVENTION

Embodiments of the present invention relate generally to integrated circuits and manufacturing methods for semiconductor devices. More particularly, embodiments of the present invention provide a method for fabricating a dual-gate fin field effect transistor (FinFET) and a tri-gate FinFET on the same SOI substrate. Merely by way of example, the invention has been applied to high current drive I/O devices and low leakage core logic devices in integrated circuits. But it would be recognized that the invention has a much broader range of applicability. For example, the invention can be applied to integrated circuits requiring devices having different threshold voltages and performance requirements.

As the semiconductor device feature size continues to scale down to the nanometer regime and approaches scaling limits for CMOS processes and technology, at such reduced gate lengths, conventional CMOS devices have difficulty in maintaining high drive current (Ion) with low leakage (Ioff) and threshold stability. To fabricate devices beyond current scaling limits, integrated circuit manufacturers are rigorously exploring alternative gate stack materials, band engineering methods, and alternative transistor structures simultaneously.

CMOS designs below 100 nm are severely constrained by lateral short channel effect (SCE) and vertical gate insulator tunneling leakage current. One of the approaches to circumvent the gate tunneling restriction is to change the device structure in such a way that MOSFET gate length can be scaled down further even with thicker oxide. A promising candidate for channel length in the 5-30 nm range is the so-called FinFET built on a silicon-on-insulator (SOI) substrate.

In low power circuit applications, there is often a need to have transistors having different threshold voltages on the same chip. For example, certain circuits need low threshold voltage for higher drive current and can tolerate higher leakage current, whereas other circuits may demand low leakage current which requires a high threshold current. In conventional technologies, it is necessary to fabricate transistors having different gate oxide thicknesses and channel doping levels to obtain multiple different threshold voltages.

For small geometry MOSFET devices, silicon-on-insulator (SOI) technology has been proposed as an alternative to bulk CMOS devices. SOI MOSFET devices are fabricated in a thin film of silicon layer overlying an insulating layer. Such devices often offer reduced parasitic effect than conventional bulk devices. Further improvement can be obtained in a FinFET in which a gate electrode is formed over the sides and the top of a channel region of a MOSFET. The channel region, along with a source region and a drain region are formed in a silicon fin structure located over an insulator. In a FinFET, the gate electrode has a better control of the channel region. In some examples, a FinFET device includes a gate electrode that is formed over three sides of a channel region. It is referred to as a tri-gate FinFET or single-gate FinFET. In other examples, a FinFET device can have two independent gate electrodes. It is referred to as a dual-gate FinFET. In conventional technology, tri-gate and dual-gate FinFETs are fabricated separately for different applications. These and other limitations are described throughout the present specification and more particularly below.

From the above, it is seen that an improved technique for processing semiconductor devices is desired.

BRIEF SUMMARY OF THE INVENTION

Embodiments of the present invention relate to integrated circuits and manufacturing methods for semiconductor devices. More particularly, embodiments of the present invention provide a method for fabricating a dual-gate FinFET and a tri-gate FinFET on the same SOI substrate. Merely by way of example, the invention has been applied to high current drive I/O devices and low leakage core logic devices in an integrated circuit. But it would be recognized that the invention has a much broader range of applicability. For example, the invention can be applied to integrated circuits requiring devices having different threshold voltages and performance requirements.

A specific embodiment of the invention provides a method for making an integrated circuit including at least a tri-gate FinFET and a dual-gate FinFET. The method includes providing a semiconductor on insulator (SOI) substrate. The SOI substrate includes a semiconductor layer overlying an insulator layer. The semiconductor layer includes a surface region. In an embodiment, the SOI substrate may include a substrate, an oxide layer overlying the substrate, and a silicon layer overlying the oxide layer. In another embodiment, the SOI substrate may include a substrate, an insulator layer overlying the substrate, and a silicon-germanium layer overlying the insulator layer. The method also includes implanting impurities into the semiconductor layer for adjusting a threshold voltage. The method includes forming a hard mask overlying the surface region, and patterning the hard mask to form a first hard mask cap portion and a second hard mask cap portion. The method also includes etching the semiconductor layer using the first and second hard mask cap portions as a mask to form a first fin and a second fin. The method also includes removing the second hard mask cap portion to expose the upper surface of the second fin and then forming a gate dielectric layer on the first fin including the first hard mask cap portion and the second fin. The method further includes forming a conductive layer overlying the gate dielectric layer and selectively etching the conductive layer to form a first gate structure for the first fin and the second gate structure for the second fin. In addition, the method includes forming an interlayer dielectric layer overlying the conductive layer and planarizing the interlayer dielectric layer using a chemical mechanical polishing process back to the upper surface of the first hard mask cap portion. In other words, the first hard mask cap portion remains on the top surface of the first fin whereas the top surface of the second fin is covered by the conductive layer.

In an embodiment, each of the first and second fins has a rectangular cross-sectional width in a range between 5 nm and 50 nm and a height in a range between 5 nm and 100 nm. In a specific embodiment, the height of the fins is greater than their width.

In an embodiment, the first and second fins are annealed in an $H_2$ ambient at a temperature ranging from about 800° C. to about 1000° C.

In an embodiment, the first fin is disposed in a core region and the second fin is disposed in an input/output region of an integrated circuit.

In an embodiment, the conductive layer may include polysilicon or metal such as W, Ta, TiN, ZrN, HfN, VN, NbN, TaN, WN, TiAlN, TaC, TaMgC, and TaCN, and a thickness in a range between 40 nm and 150 nm. The interlayer may include high-K dielectric materials such as $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, and $Y_2O_xN_y$, wherein x and y are integer. The hard mask may include SiN, $SiO_2$, and SiON.

In an embodiment, the method includes forming spacers and implanting impurities to form source and drain regions at distal ends of the fins. In an embodiment, the method may include forming elevated source and drain regions by forming a SiGe layer on the source and drain regions using selective epitaxial growth at a temperature of about 700-800° C. in an ambient of $SiH_2Cl_2$+HCl+$GeH_4$. In an embodiment, the SiGe layer has a thickness ranging from about 100 nm to about 500 nm. In a specific embodiment, the backend process includes depositing interlayer dielectrics, forming contact regions, and forming interconnects. In some embodiments, the interconnects can include copper interconnect lines. In a specific embodiment, the dielectrics comprise low-k dielectrics. In an embodiment, the contact regions include tungsten plugs.

An alternative embodiment of the invention provides an integrated circuit device. The device includes a silicon-on-insulator (SOI) substrate having a silicon layer overlying an insulator layer. The device includes a first silicon fin and a second fin formed on the silicon layer. Each of the first and second fins has a rectangular cross-sectional width of about 5 to 50 nm and a height of about 5 to 100 nm. The first silicon fin includes a first source region and a first drain region disposed at its distal ends, and a first channel region disposed between the first source and drain regions. The first channel region includes first and second side surfaces and a first upper surface. The second silicon fin includes a second source region and a second drain region that are disposed at its distal ends, and a second channel region disposed between the second source and drain regions. The second channel region includes third and fourth side surfaces and a second upper surface. The device includes a gate dielectric layer that is formed on the first and second surfaces of the first silicon fin and on the third, fourth side surfaces and on the second upper surface of the second silicon fin. The first fin is associated with a dual-gate FinFET, which includes a first gate electrode overlying the gate dielectric disposed on the first surface and a second gate electrode overlying on the gate dielectric disposed on second surface of the first fin. The first gate electrode and the second gate electrode are electrically insulated from each other by a nitride capping layer that is disposed on the first upper surface of the first fin. The second fin is associated with a tri-gate FinFET, which includes a third gate electrode overlying the gate dielectric on the third and fourth surfaces and the second upper surface of the second fin.

In an embodiment of the present invention, the source and drain regions of the dual-gate FinFET are elevated. In another embodiments, the source and drain regions of the tri-gate FinFET are elevated. In a specific embodiment, the silicon layer has a thickness of about 5-100 nm. In an embodiment, the channel region of the tri-gate FinFET is characterized by a width of about 5-50 nm and a length of about 5-30 nm. In a specific embodiment, the dual-gate FinFET is operated in a weak inversion region.

In yet an alternative embodiment, the invention provides a method of operating an integrated circuit. The method includes providing an SOI substrate, and providing a first circuit region and a second circuit region in the SOI substrate. The method includes forming a tri-gate FinFET in the first circuit region. The tri-gate FinFET includes a drain electrode, a source electrode, and a gate electrode. The method further includes forming a dual-gate FinFET in the second circuit region. The dual-gate FinFET includes a drain electrode, a source electrode, a first gate electrode and a second gate electrode. The method also includes applying a first bias voltage and a second bias voltage to the drain electrode and source electrode of the tri-gate FinFET, respectively, and receiving a first signal at the gate electrode of the tri-gate FinFET. The method includes applying a third bias voltage and fourth bias voltage to the drain electrode and the source electrode of the dual-gate FinFET, respectively, and receiving a second signal and a third signal at the first and second gate electrodes of the tri-gate FinFET, respectively. In a specific embodiment, the tri-gate FinFET includes a channel region which is surrounded by a gate electrode on three sides. In an embodiment, the dual-gate FinFET includes a channel region sandwiched between the first and second gate electrodes, and the first gate electrode is insulated from the second gate electrode by a nitride region. In a specific embodiment, the first circuit region is an I/O region, and the second circuit region is a core logic region. In an embodiment, the third signal is a dynamic signal. In yet another embodiment, the dual-gate FinFET is operated in a weak inversion region.

Embodiment of the present invention can provide many benefits over conventional techniques. A specific embodiment of the present invention provides a method for forming a single tri-gate FinFETs and a split Dual-gate FinFETs on the same semiconductor chip. In some embodiments, the tri-gate FETs (single gate FinFETs) will be implemented in the first I/O device with the highest voltage power supply VD to maximize current drive capability. In some embodiments, split dual-gate FinFETs will be implemented in the core device and/or a secondary I/O devices where Ioff can be minimized. In some embodiments, the two gates in the split Dual-gate FinFETs can be electrically and logically independently biased to control the fin channel. Device characteristics such as threshold voltage and sub-threshold swing (SS) can be modulated dynamically for increased circuit design flexibility. A specific embodiment of the invention provides a method that can be implemented using conventional process technology and equipment. Depending upon the embodiment, one or more of these benefits may be achieved. These and other benefits are described throughout the present specification and more particularly below.

BRIEF DESCRIPTION OF THE DRAWINGS

The accompanying drawings, which are incorporated herein and form a part of the specification, illustrate the present invention and, together with the description, further serve to explain embodiments of the invention.

DETAILED DESCRIPTION OF THE INVENTION

Embodiments of the present invention relate to integrated circuits and the processing for the manufacture of semiconductor devices. More particularly, embodiments of the present invention provide a method and device for providing a dual-gate FinFET and a tri-gate FinFET on the same SOI substrate. Merely by way of example, the invention has been applied to high current drive I/O devices and low leakage core logic devices in integrated circuits. But it would be recognized that the invention has a much broader range of applicability. For example, the invention can be applied to integrated circuits requiring devices having different threshold voltages and performance requirements.

Depending upon the embodiment, the present invention includes various features, which may be used. These features include the following:

1. Simultaneous fabrication of tri-gate and dual-gate FinFETs on a same substrate;
2. Fabrication method using conventional process and equipment; and
3. Method for using tri-gate FinFETs in I/O circuits and dual-gate FinFETs in core logic circuits.

As shown, the above features may be included in one or more of the embodiments to follow. These features are merely examples, which should not unduly limit the scope of the claims herein. One of ordinary skill in the art would recognize many variations, modifications, and alternatives.

Figure 1A:
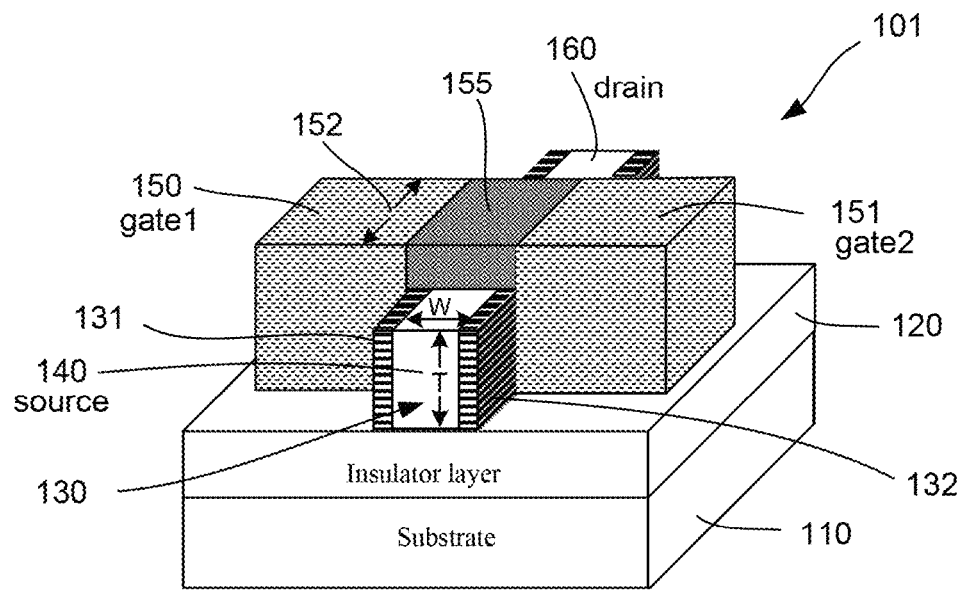
FIG. 1A is a simplified cross-sectional view diagram of a split dual-gate FinFET device according to an embodiment of the present invention.

FIG. 1A is a simplified diagram of a dual-gate FinFET device 101 according to an embodiment of the present invention. This diagram is merely an example, which should not unduly limit the scope of the claims herein. One of ordinary skill in the art would recognize other variations, modifications, and alternatives. As shown, dual-gate FinFET device 101 includes a substrate 110, and an insulator layer 120 overlying the substrate. In an embodiment, substrate 110 may comprise silicon, and insulator layer 120 may comprise silicon oxide. Dual-gate FinFET 101 also includes a silicon fin region 130 on the insulator layer 120. In a specific embodiment, silicon fin region 130 is a rectangular block of silicon characterized by a thickness or height of about 5 nm to about 100 nm and a width of about 5 nm to about 50 nm.

The dual-gate FinFET 101 also includes gate oxide regions 131 and 132 disposed on the sides of the silicon fin region. A gate region 150 is disposed on one side of the silicon fin region and is separated from the silicon fin region by gate oxide region 131. A gate region 151 is disposed on an opposing side of the silicon fin region and is separated from the silicon fin region by gate oxide region 132. An end portion of silicon fin region 130 includes a source region 140, and the opposing end portion of the silicon fin region includes a drain region 160. As shown, gate region 150, gate oxide 131 and silicon fin region 130 are associated with an MOS transistor, which also includes a source region 140 and a drain region 160 at its distal ends. Gate 150 is characterized by a width 152 which is associated with a channel length of the transistor. In an embodiment, the channel length is about 5-30 nm. In an embodiment, source region 140 and drain region 160 disposed at the distal ends of the silicon fin region may include silicon germanium (SiGe). In another embodiment, source region 140 and drain region 160 disposed at the distal ends of the silicon fin region may include silicon carbide (SiC).

Referring still to FIG. 1A, a second MOS transistor is formed with gate region 151, gate oxide 132, silicon fin region 130, source region 140 and drain region 160. In an embodiment, the silicon fin has a thickness (height) in a range between about 5 nm to about 100 nm. Each MOS transistor has a front gate that controls the conductivity of its channel and a back gate that controls the body potential of the transistor. As shown, an insulator region 155 lies above the top surface of silicon fin region 130. The insulator region separates gate region 150 from gate region 151. Therefore, gate 150 and gate 151 can be independently biased to control current flow in the fin channel, and allow device characteristics such as threshold voltage and sub-threshold swing (SS) to be adjusted for specific applications. In some embodiments, the dual gates can be used to dynamically modulate the characteristics of the FinFET, i.e., a control signal derived from a part of the circuit can be applied to one of the dual gates to modulate the current flow and affect the behavior of the dual-gate FinFET. As an example, the dual-gate FinFET can be utilized in core logic circuits applications which demand low leakage current.

Figure 1B:
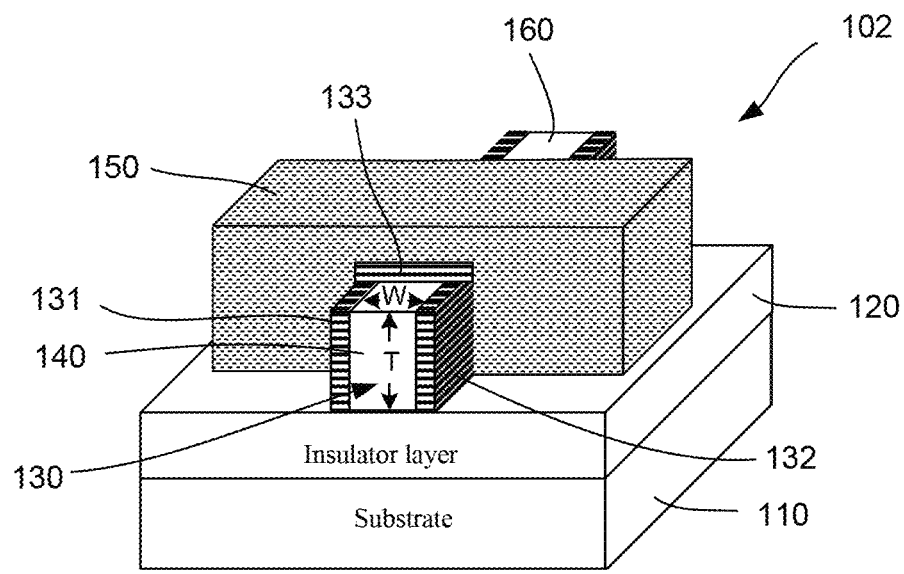
FIG. 1B is a simplified cross-sectional view diagram of a tri-gate FinFET device according to an embodiment of the present invention.

FIG. 1B is a simplified diagram of a single-gate or tri-gate FinFET device 102 according to an embodiment of the present invention. This diagram is merely an example, which should not unduly limit the scope of the claims herein. One of ordinary skill in the art would recognize other variations, modifications, and alternatives. As shown in FIG. 1B, single-gate FinFET device 102 includes similar device elements as in dual-gate FinFET 101, e. g., substrate 110, insulator layer 120, silicon fin 130, gate oxide regions 131 and 132, source region 140, drain region 160, and gate region 150. However, FinFET 102 has a single continuous gate region 150 which is disposed on three sides (i.e., opposite sides and the top surface) of silicon fin 130 and is separated from the silicon fin by gate oxide regions 131, 132, and 133. Therefore, an MOS transistor is formed with gate region 150 modulating a bias voltage on three sides of the fin channel. The single-gate or tri-gate FinFET is capable of providing large current drive thank to the wide effective channel width provided by the three sides of the silicon fin. Such large current drive is advantageous in, for example, I/O circuit applications.

In an embodiment of the present invention, a dual-gate FinFET device and a single-gate FinFET device are provided on the same substrate. In an embodiment, an integrated circuit chip includes single-gate FinFETs in I/O circuits and dual-gate FinFETs in core logic circuits. Of course, one of ordinary skill in the art would recognize other variations, modifications, and alternatives.

Figure 2:
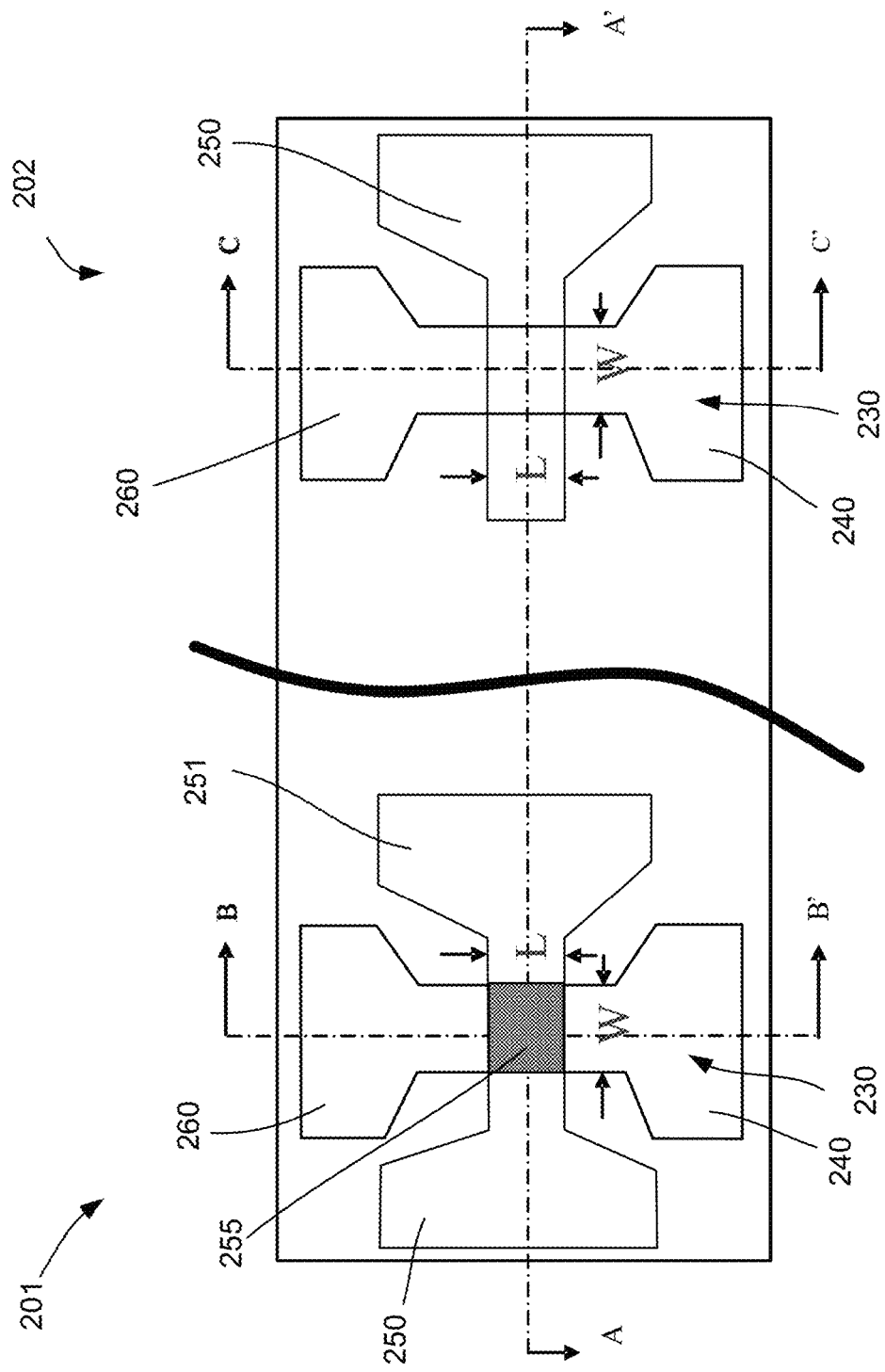
FIG. 2 is a simplified top view layout diagram for a dual-gate FinFET device and a tri-gate FinFET device according to an embodiment of the present invention.

FIG. 2 is a simplified top view layout diagram for a dual-gate FinFET 201 device and a tri-gate FinFET 202 device according to an embodiment of the present invention. This diagram is merely an example, which should not unduly limit the scope of the claims herein. One of ordinary skill in the art would recognize other variations, modifications, and alternatives. As shown, dual-gate FinFET 201 includes a silicon fin region 230, a source region 240, and a drain region 260. FinFET 201 also includes gate regions 250 and 251, separated by nitride region 255. In an embodiment, the channel width W is about 5-50 nm, and the channel length L is about 5 nm to about 30 nm. The widened areas for source, drain, and gates are used for contact formation. Also shown in FIG. 2, tri-gate FinFET 202 includes a silicon fin region 230, a source region 240, and a drain region 260. FinFET 202 also includes a single gate region 250. In an embodiment of FinFET 202, the channel width W is about 5-50 nm, and the channel length L is about 5-30 nm. In a specific embodiment, the channel width of the FinFET is larger than the channel length.

A method for fabricating an integrated circuit device according to an embodiment of the present invention may be outlined as follows:

1. Provide a silicon on insulator (SOI) wafer having a semiconductor layer on an insulator layer and threshold voltage implant;
2. Form a hard mask overlying the semiconductor layer;
3. Pattern the hard mask to form a first cap portion and a second cap portion;
4. Etch the semiconductor layer using the patterned hard mask to form first and second fin regions;
5. Remove the second cap portion to expose the top surface of the second fin region;
6. Form a gate dielectric layer on opposite sides of the first silicon fin region and on three sides of the second fin region;
7. Deposit a conductive layer;
8. Selectively etch the conductive layer to form a first gate structure for the first fin region and a second gate structure for the second fin region;
9. Forming source/drain regions at distal ends of the first and second fin regions;
10. Form an interlayer dielectric layer over the conductive layer;
11. Planarize the interlayer dielectric layer by chemical mechanical polishing (CMP) using the first cap portion as a polish stop;
12. Form elevated source/drain regions; and
12. Perform a backend process.

The above sequence of steps provides a method for fabricating an integrated circuit including a dual gate FinFET and a tri-gate FinFET according to an embodiment of the present invention. As shown, the method uses a combination of steps including a way of fabricating a dual gate FinFET and a single-gate (tri-gate) FinFET on the same SOI substrate. Other alternatives can also be provided where steps are added, one or more steps are removed, or one or more steps are provided in a different sequence without departing from the scope of the claims herein. Further details of the present method can be found throughout the present specification and more particularly below.

Figure 3:
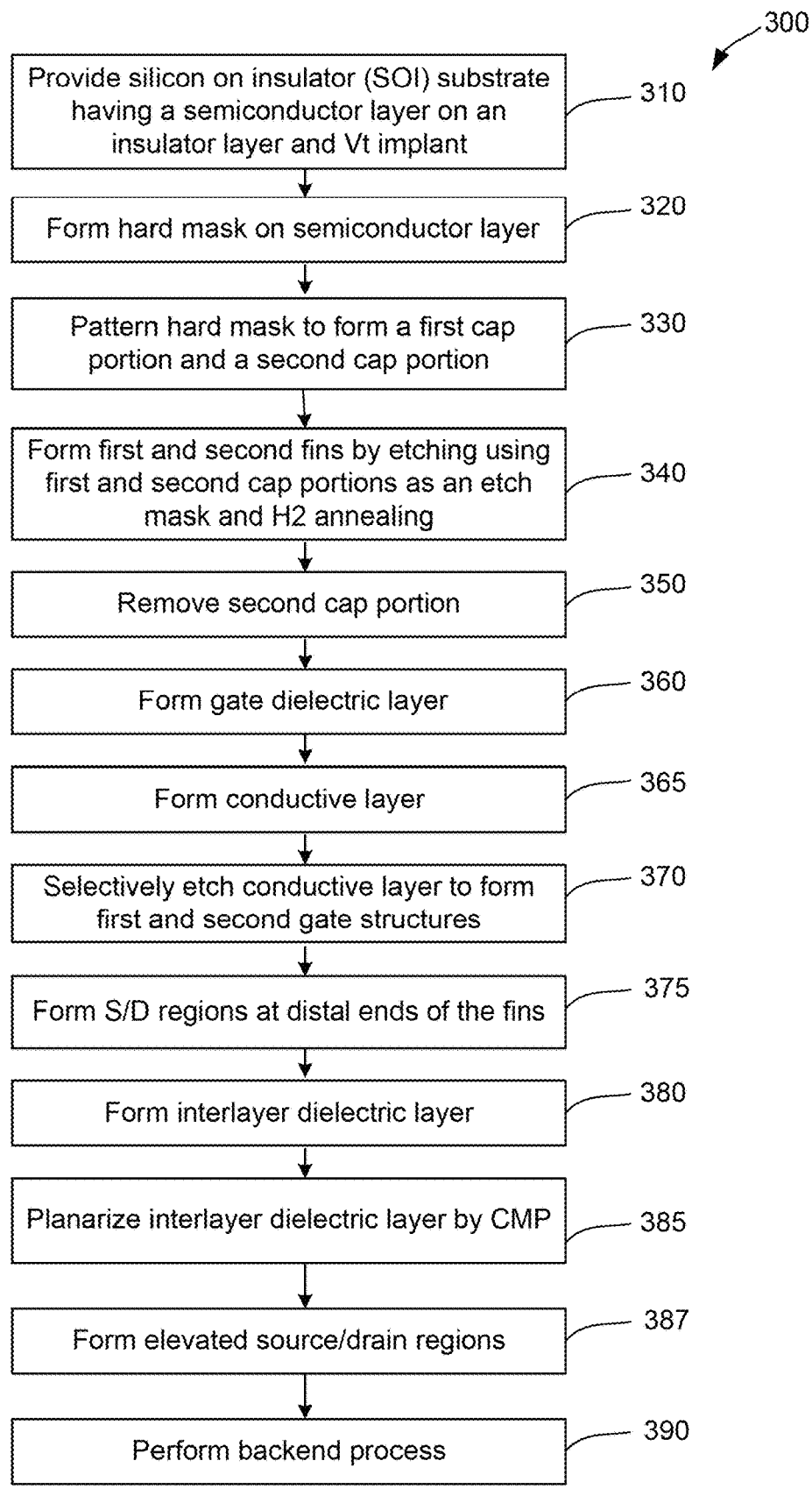
FIG. 3 is a simplified flowchart diagram of a method for making a dual-gate FinFET device and a tri-gate FinFET device according to an embodiment of the present invention.

To summarize the above steps, FIG. 3 is a simplified process flow diagram illustrating a method 300 for fabricating a dual-gate FinFET device and a tri-gate FinFET device according to an embodiment of the present invention. This diagram is merely an example, which should not unduly limit the scope of the claims herein. One of ordinary skill in the art would recognize other variations, modifications, and alternatives. The processes in FIG. 3 will be discussed with reference to FIGS. 4-15.

FIGS. 4 to 15 are simplified cross-sectional view diagrams of a method for fabricating a dual-gate FinFET device and a tri-gate FinFET device according to an embodiment of the present invention. These diagrams are merely examples, which should not unduly limit the scope of the claims herein. One of ordinary skill in the art would recognize other variations, modifications, and alternatives. As shown, the method according to an embodiment of the invention starts by providing a silicon on insulator (SOI) substrate (process 310 in FIG. 3).

Figure 4:
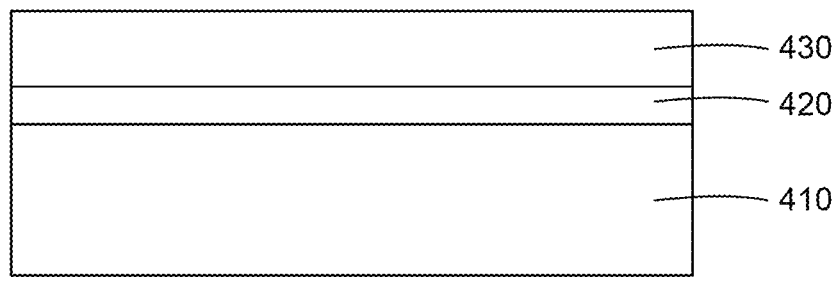
FIGS. 4-10 and FIGS. 11, 11A-D, 12A, 12B, 13A, 13B, 14A, 14B, 15A, and 15B are simplified cross-sectional view diagrams of a method for making a dual-gate FinFET device and a tri-gate FinFET device according to an embodiment of the present invention.

FIG. 4 is a simplified cross-sectional view diagram of a method according to an embodiment of the present invention along cross section AA' of FIG. 2. As shown in FIG. 4, the SOI substrate in an embodiment of the invention includes a silicon substrate 410, a silicon dioxide layer 420 overlying the silicon substrate, and a semiconductor layer 430 overlying the silicon dioxide layer. In an embodiment, the semiconductor layer 430 includes silicon. In an alternative embodiment, the semiconductor layer 430 may include silicon germanium (SiGe). In an embodiment, semiconductor layer 430 may have a thickness in a range between about 5 nm and 100 nm. Process 310 also includes performing threshold adjustment implant (Vt implant). In an embodiment, the channel doping is around $1-5\times10^{18}/cm^3$ for an N-type FinFET. In a specific embodiment, threshold adjustment implant is performed using boron containing impurities at a dose of $1-5\times10^{12}/cm^2$ and an implantation energy of 1-30 KeV. In other embodiments, a P-type FinFET receives N-type impurities such as arsenic or phosphorus at a dose of $1-5\times10^{12}/cm^2$ and implant energy of 1-20 KeV. These implant conditions are merely examples, which should not unduly limit the scope of the claims herein. One of ordinary skill in the art would recognize other variations, modifications, and alternatives.

Figure 5:
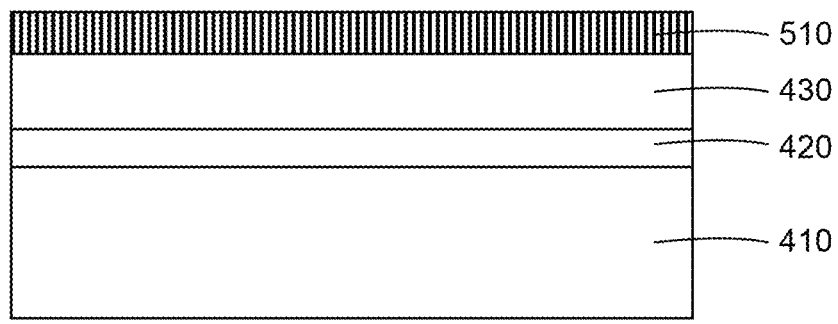

FIG. 5 is a simplified view diagram of a method according to an embodiment of the present invention. As shown in FIG. 5, the method includes (process 320) forming a hard mask 510 on semiconductor layer 430. In an embodiment, a hard mask may include a silicon nitride (SiN) layer that is deposited on semiconductor layer 430 at a temperature range of approximately 700-800° C. to a thickness of about 100-500 nm. In other embodiments, hard mask 510 may include silicon dioxide ($SiO_2$) or silicon oxide nitride (SiON). Of course, there can be other variations, modifications, and alternatives.

Figure 6:
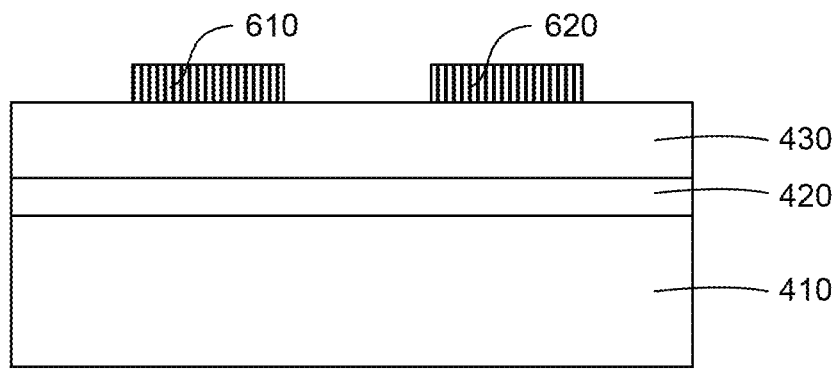

In process 330, the hard mask is patterned as shown in FIG. 6. FIG. 6 is a simplified cross-sectional view diagram of a method according to an embodiment of the present invention. In an embodiment, the SOI substrate includes a first region for core logic devices and a second region for I/O devices. In a specific embodiment, dual-gate FinFETs are provided in a core logic region, and tri-gate FinFETs are provided in an I/O circuit region. In process 330, the hard mask is patterned to form a first hard mask cap portion 610 and a second hard mask cap portion 620.

Figure 7:
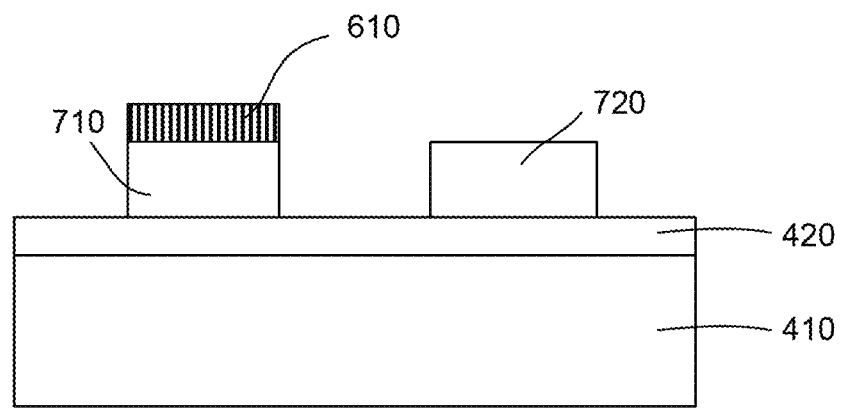

In process 340, silicon fin regions are defined. Here, semiconductor layer 430 is etched using the patterned hard mask as an etch mask to form fin regions. In a specific embodiment, conventional reactive ion etching (RIE) process is used to etch semiconductor layer 430. FIG. 7 is a simplified cross-sectional view diagram of a method according to an embodiment of the present invention. FIG. 7 shows a first silicon fin region 710 under first hard mask cap portion 610 for a dual-gate FinFET device and a second silicon fin region 720 of a single-gate FinFET device under second hard mask cap portion 620.

The method then proceeds to process 350 which removes second hard mask cap portion 620. Second hard mask cap portion 620 can be removed using techniques known in the art such as, for example, ME, wet or dry etching and the like. The silicon fin regions are then annealed in an H₂ ambient at a temperature ranging from about 800° C. to about 1000° C. Silicon fin regions 710, 720 defined in process 340 are used as FET active areas, including source, channel, and drain regions, as will be discussed more in detail below. Of course, there can be other variations, modifications, and alternatives.

Figure 8:
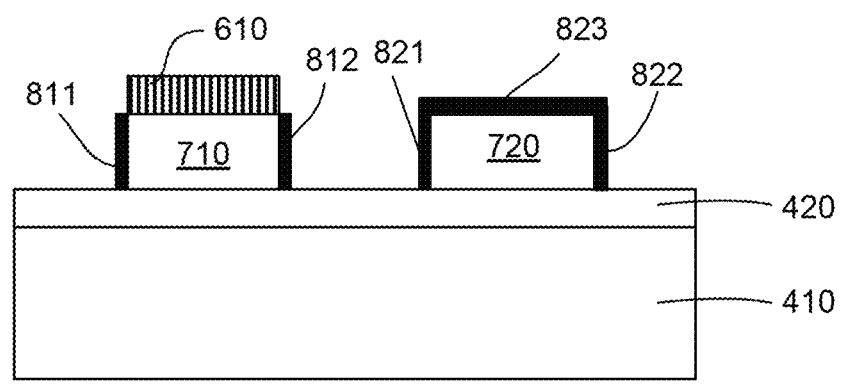

FIG. 8 is a simplified cross-sectional view diagram of a method according to an embodiment of the present invention. In process 360, a gate dielectric layer is formed over the fin regions. As shown in FIG. 8, gate dielectric regions 811 and 812 are formed on the sides of silicon fin region 710 in the dual-gate FinFET region. A gate dielectric layer is formed on the surfaces of silicon fin region 720 in the single-gate FinFET region, identified as 821, 822, and 823. In an embodiment, process 360 includes the following steps:
1. Base oxide grow with in situ steam-generated (ISSG) or rapid thermal oxidation (RTO) at a temperature range of about 700° C. to 900° C. to a thickness of about 0.1-3 nm;
2. Decoupled Plasma nitridation (DPN) in a nitrogen ambient; and
3. Post nitridation anneal (PNA).

In an embodiment, the gate dielectric layer includes one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, and $Y_2O_xN_y$, wherein x and y are integer, or other high-K dielectric materials. Of course, there can be other variations, modifications, and alternatives.

Figure 9:
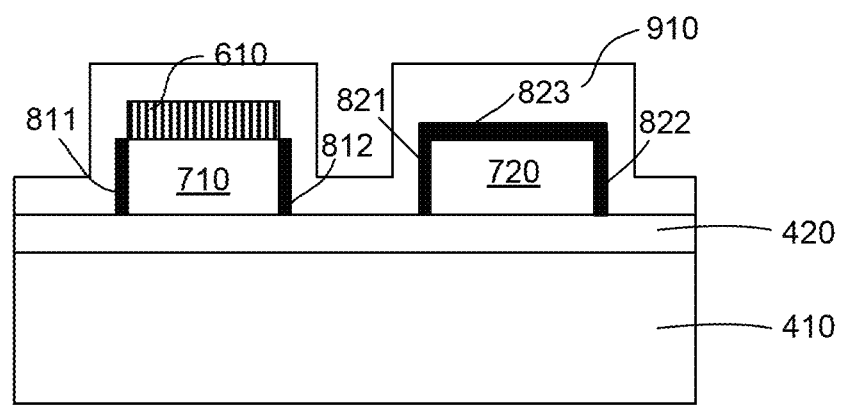

In process 365, a conductive layer is deposited over the gate dielectric layer. In an embodiment, the conductive layer includes a metal material comprising one of W, Ta, TiN, ZrN, HfN, VN, NbN, TaN, WN, TiAlN, TaC, TaMgC, and TaCN, and an alloy thereof. The conductive layer can be formed by chemical vapor deposition (CVD), physical vapor deposition (PVD), atomic layer deposition (ALD), vacuum evaporation, and the like. In another embodiment, the conductive layer may include polysilicon. In yet another embodiment, the conductive layer may include conductive refractory metal nitrides. In an embodiment, the conductive layer may have a thickness in a range between about 100 nm to about 500 nm, and preferably in a range between about 40 nm and about 150 nm. FIG. 9 is a simplified cross-sectional view diagram illustrating a conductive layer 910 overlying gate dielectric regions 821, 822, 823 of second fin region 720, and gate regions 811, 812, and first cap portion 610 of first fin region 710 according to an embodiment of the present invention.

Figure 10:
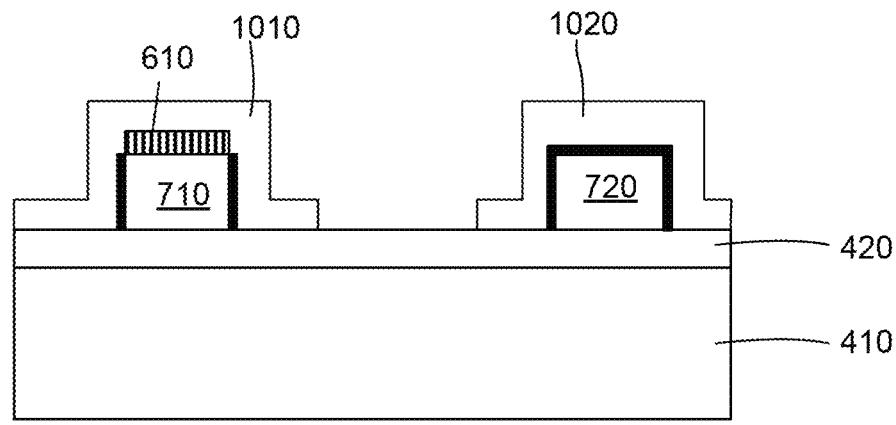

A photolithographic and etch process is performed in process 370 to form gate structures for fin regions. As shown in FIG. 10, the conductive layer 910 is selectively etched to form a first gate structure 1010 for first fin region 710 and a second gate structure 1020 for second fin region 720.

Figure 11:
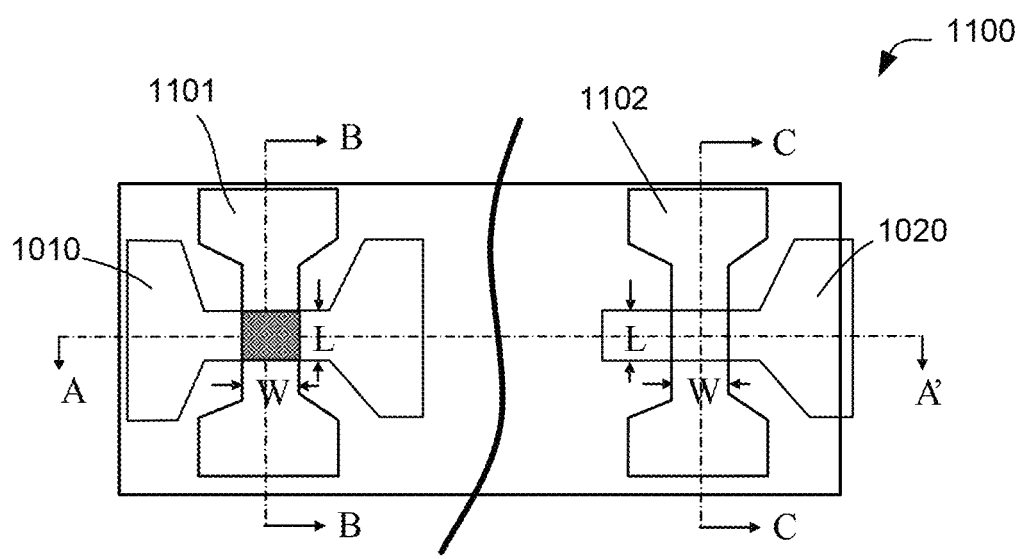

In process 375, a source/drain ion implantation is performed to form sources and drains in the fin regions on both distal ends of first and second fin regions 710 and 720. In an embodiment, the source/drain ion implantation may be performed prior to forming gate sidewall spacers. FIG. 11, similar to FIG. 2, is a simplified top view layout diagram according to an embodiment of the invention. FIG. 11 includes dashed line marked AA' which extends through the gate electrode patterns of a dual-gate FinFET 1101 on the left and a tri-gate FinFET 1102 on the right. FIG. 11 also includes dashed lines BB' extending through the first fin region of first FinFET 1101 on the left and dashed CC' extending through the second fin region of a second FinFET 1102 on the right.

Figure 11A:
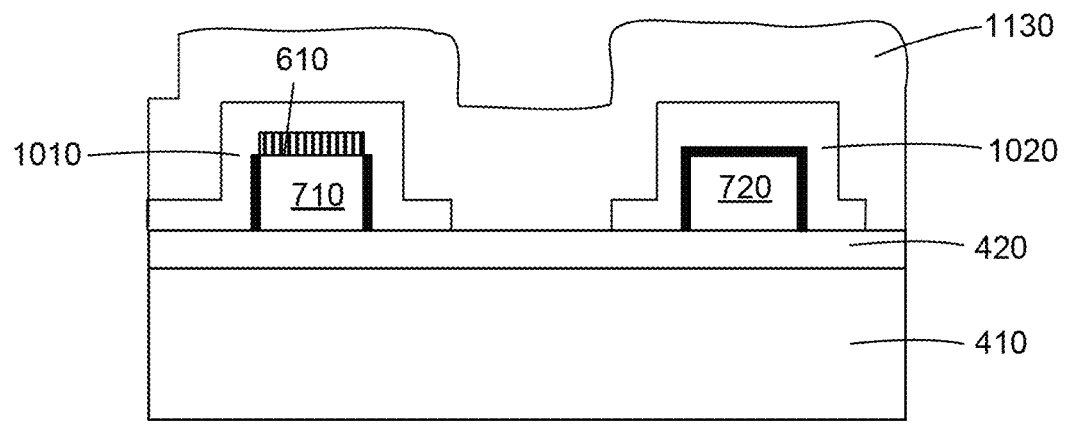
Figure 11B:
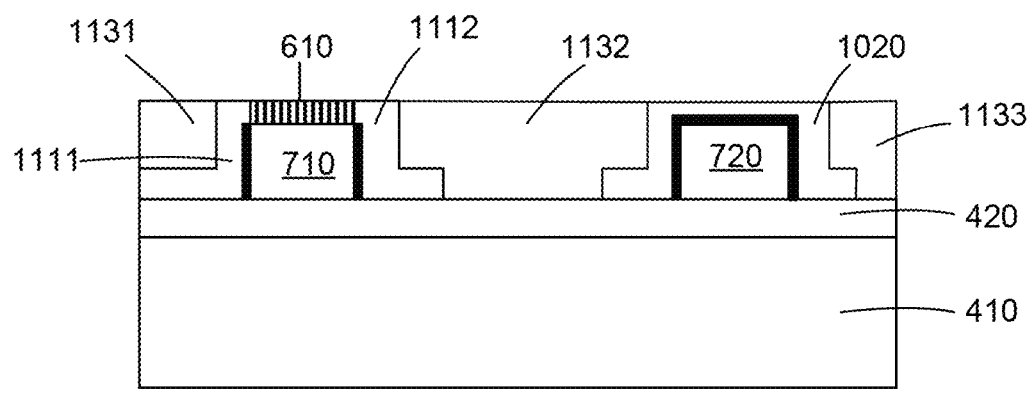

In process 380, an interlayer dielectric layer 1130 is formed overlying first and second gate structures 1010 and 1020. FIG. 11A is a simplified cross-sectional view diagram of a method according to an embodiment of the present invention. In process 385, interlayer dielectric layer 1130 is planarized by chemical mechanical polish (CMP) using first hard mask cap portion 610 as a polish stop. As shown in FIG. 11B, after CMP, first gate structure 1010 is divided into a first gate electrode 1111 and a second gate electrode 1112, the first and second gate electrodes are electrically insulated from each other. In contrast, second gate structure 1020 is disposed continuously across second fin region 1102. In other words, second gate structure 1020 covers the top surface and side surfaces of second fin region 720 to form tri-gate FinFET 1102 on the right, whereas each of the gate electrodes 1111 and 1112 covers one side of the first fin region to form dual-gate FinFET 1101 on the left, as shown in FIG. 11.

Referring still to FIG. 11B, the planarization process stops when the upper surface of first hard makes cap portion 610 is exposed. The CMP process thus divides first gate structure 1010 into two gate electrodes 1111 and 1112. The planarization process also divides interlayer dielectric layer 1130 into three portions 1131, 1132, and 1133 that are separated by first and second fin regions 710 and 720.

Figure 11C:
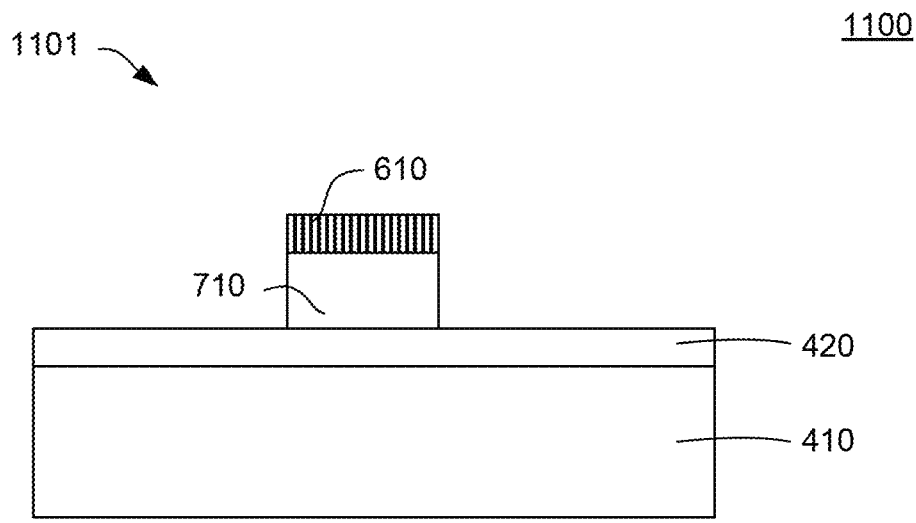

FIG. 11C is a simplified cross-sectional view diagram of dual-gate FinFET 1101 along the BB' direction of FIG. 11. As shown, first hard mask cap portion 610 is disposed on the top surface of first silicon fin region 710.

Figure 11D:
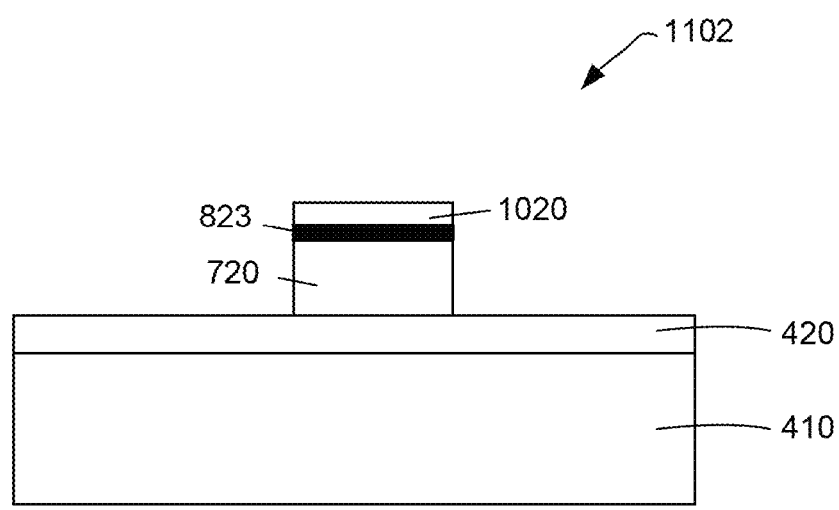

FIG. 11D is a simplified cross-sectional view diagram of tri-gate FinFET 1102 along the CC' direction of FIG. 11. As shown, second gate structure 1020 is disposed on gate dielectric layer 823 which is disposed on the top surface of silicon fin region 720.

Figure 12A:
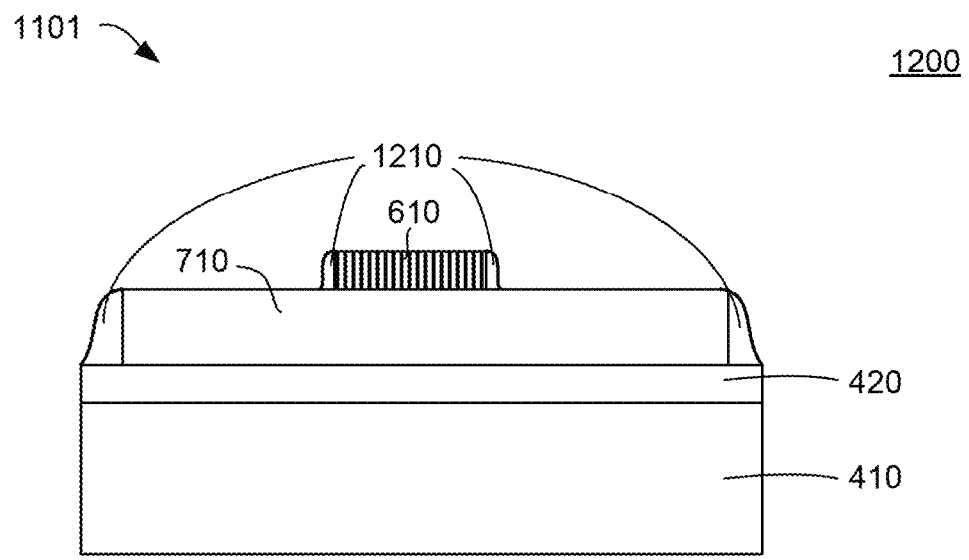
Figure 12B:
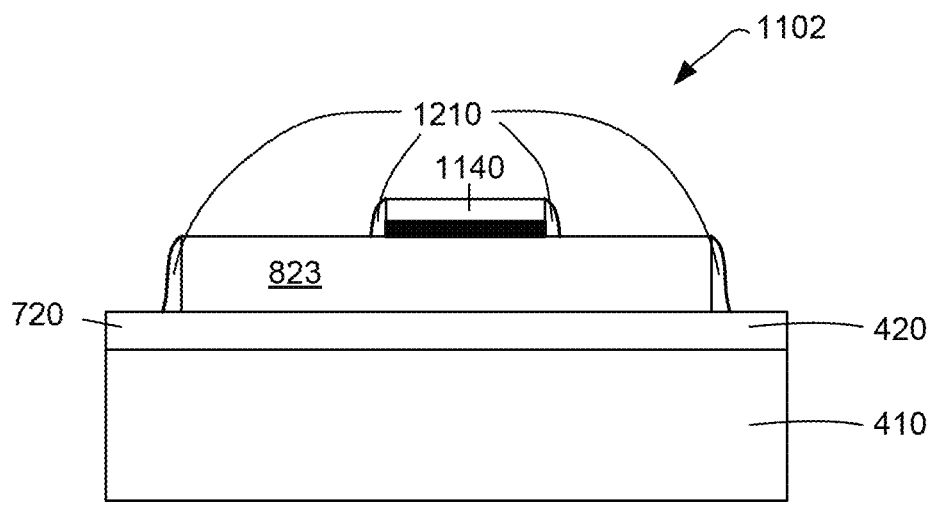

FIG. 12A is a simplified cross-sectional view diagram of dual-gate FinFET 1101 along the BB' direction of FIG. 11 according to an embodiment of the invention. FIG. 12B is a simplified cross-sectional view diagram of tri-gate FinFET 1102 along the CC' direction of FIG. 11 according to an embodiment of the invention. In an embodiment, the method of forming dual-gate and tri-gate FinFETs includes forming ONO (oxide-nitride-oxide) spacers. The method first performs gate nitridation, followed by an high temperature oxidation (HTO) offset process. The method then forms a nitride spacer. The method also includes forming HTO layer and RIE etching to form spacers 1210 as shown in FIGS. 12A and 12B. Of course, there can be other variations, modifications, and alternatives.

Figure 13A:
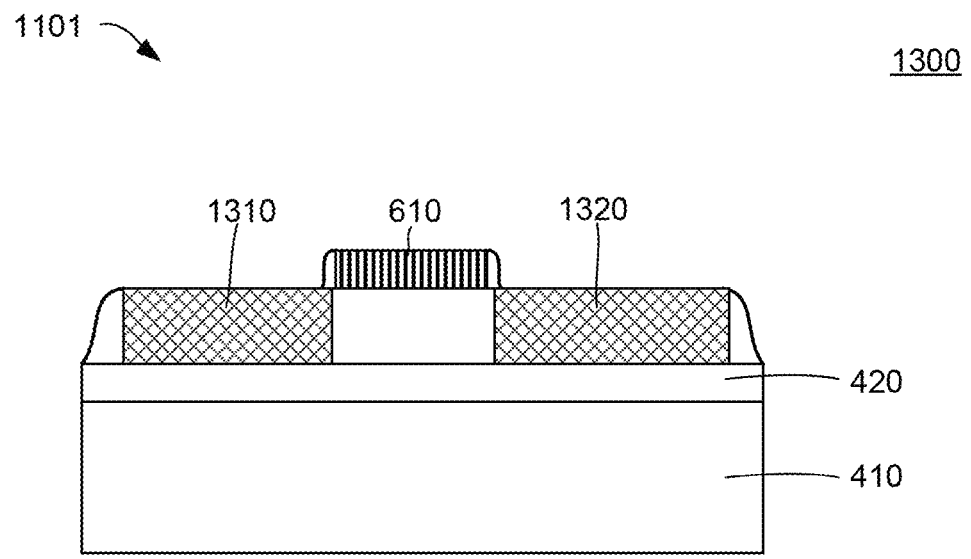
Figure 13B:
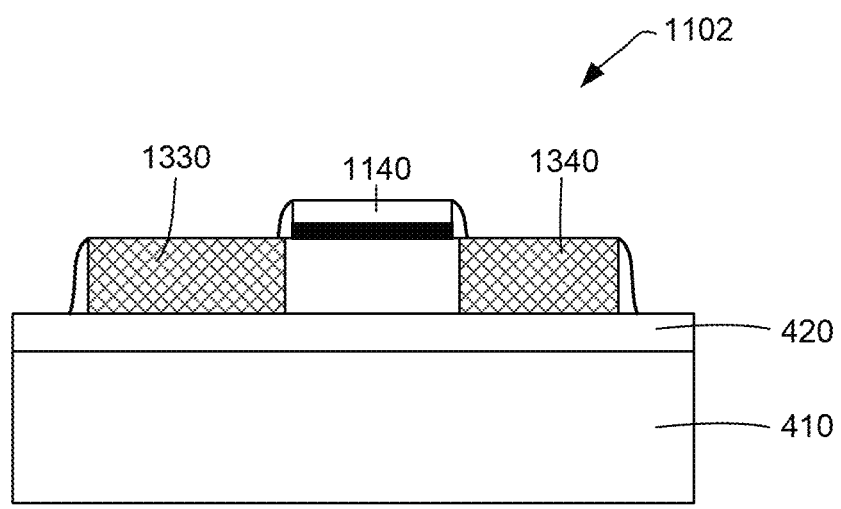

The method also includes implanting impurities to form source regions 1310 and 1330, and drain regions 1320 and 1340 as shown in FIGS. 13A and 13B. FIG. 13A is a simplified cross-sectional view diagram of dual-gate FinFET 1101 along the BB' direction of FIG. 11 according to an embodiment of the invention. FIG. 13B is a simplified cross-sectional view diagram of tri-gate FinFET 1102 along the CC' direction of FIG. 11 according to an embodiment of the invention. For N-type FinFET, the source/drain implantation includes, for example, N-type impurities such as As, at a dose of about $1-5 \times 10^{15}/cm^2$ and an energy of less than 1.0 KeV. In specific embodiments, tilt angles of 1°-30° degrees are used. For P-type FinFET, source/drain implantation includes P-type impurities such as boron at a dose of about $1-5 \times 10^{15}/cm^2$, and an energy of less than 1.0 KeV. In specific embodiments, tilt angles of 1°-30° degrees are used. The method also includes performing spike anneal at a temperature range of about 1000-1100 degrees Celsius. Of course, there can be other variations, modifications, and alternatives.

Figure 14A:
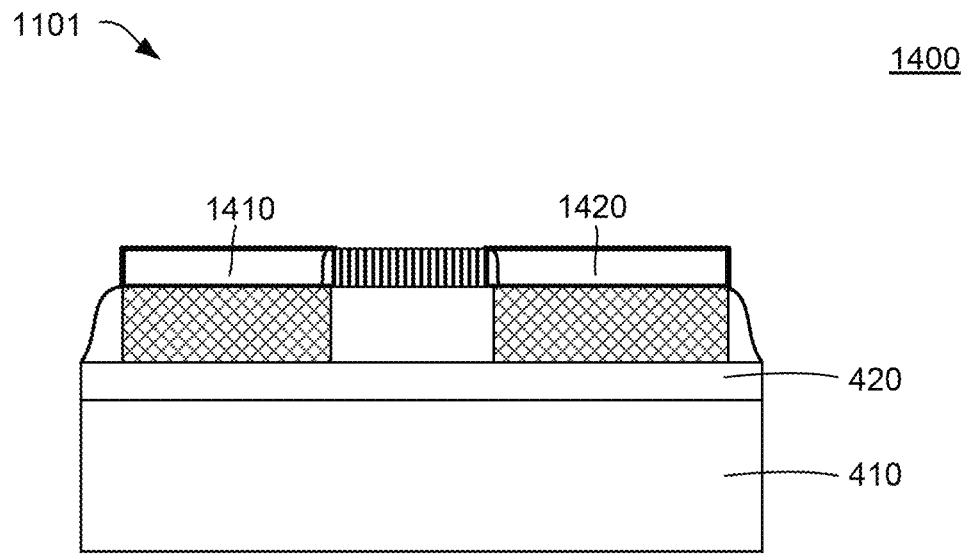
Figure 14B:
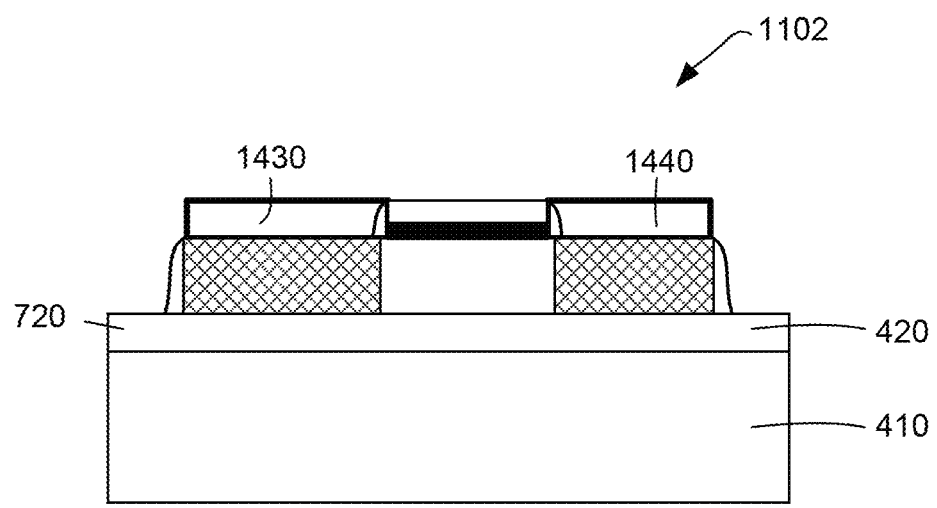

In specific embodiments, the method includes process 387 that forms elevated source/drain structures 1410, 1420, 1430, and 1440 as shown in FIGS. 14A and 14B. FIG. 14A is a simplified cross-sectional view diagram of dual-gate FinFET 1101 along the BB' direction of FIG. 11 according to an embodiment of the invention. FIG. 14B is a simplified cross-sectional view diagram of tri-gate FinFET 1102 along the CC' direction of FIG. 11 according to an embodiment of the invention. Where FinFETs 1101, 1102 are p-type FinFET, the formation of elevated source/drain structures 1410, 1420, 1430, and 1440 may include Selective Epitaxial Growth (SEG) of SiGe at a temperature range of about 700-800° C. in an ambient of $SiH_2Cl_2+HCl+GeH_4$. In some embodiments, the SiGe layer may have a thickness of about 100-500 nm and a germanium (Ge) content of about 10-30%. In some embodiments, the SiGe layer is also doped with boron at a concentration of about $1-5 \times 10^{20}$ $cm^{-3}$. Of course, there can be other variations, modifications, and alternatives.

Alternatively, where FinFETs 1101, 1102 are n-type FinFET, silicon carbide can be epitaxially deposited on source/drain structures 1410, 1420, 1430, and 1440 using in-situ doping techniques. That is, impurities such as phosphorous (P) or arsenic (As) are introduced while the silicon carbide material grows. In an embodiment, a p-type impurity concentration can be in the range from about $1 \times 10^{19}$ to about $1 \times 10^{20}$ atoms/cm$^3$. Of course, there can be other variations, modifications, and alternatives.

Figure 15A:
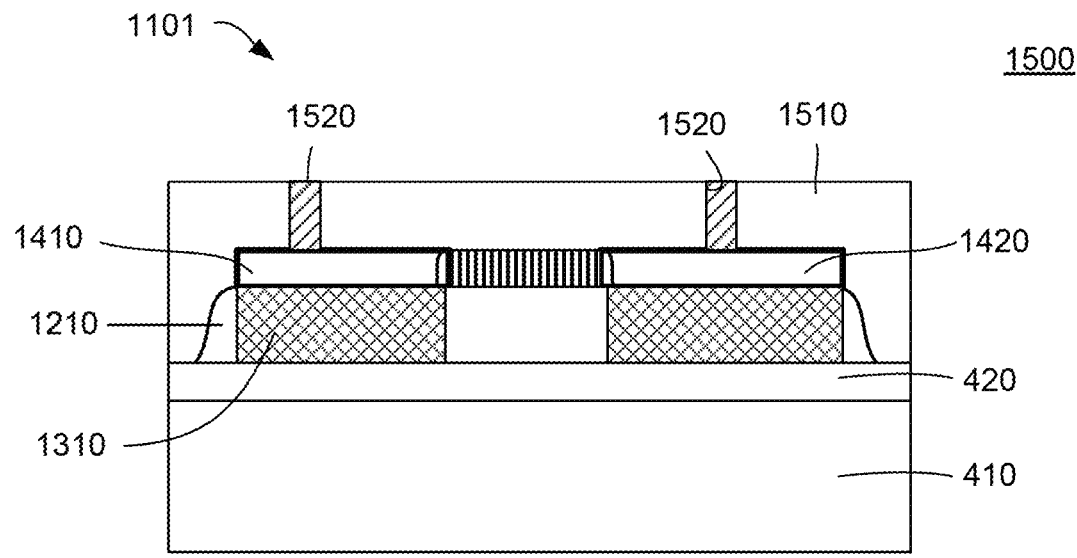
Figure 15B:
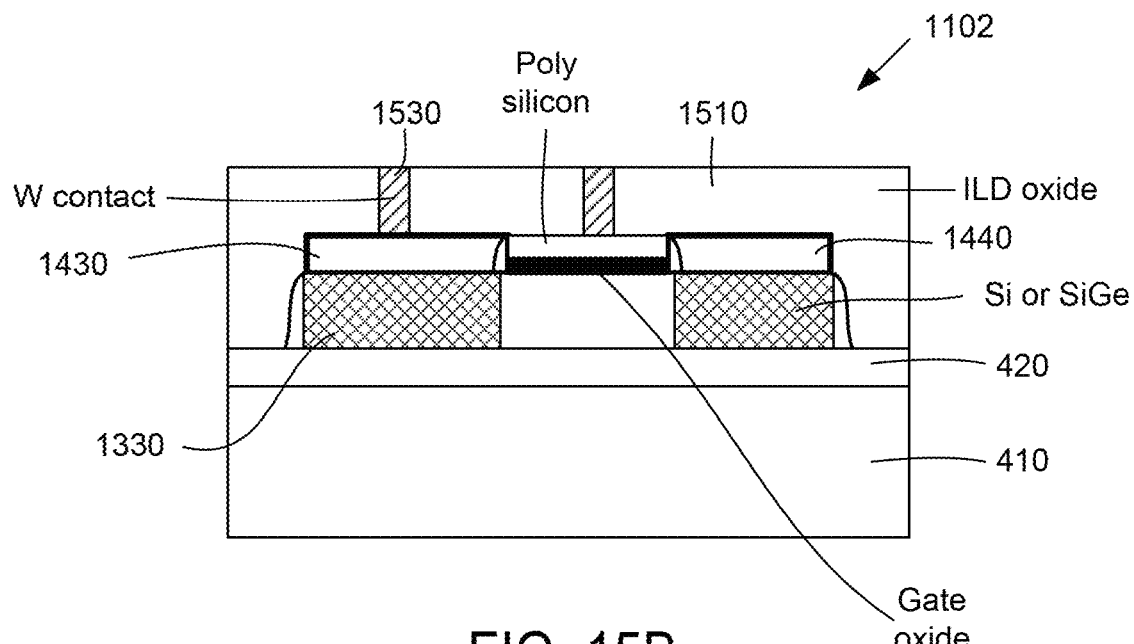

In some embodiments of the present invention, the method also includes performing backend processing. As shown in FIGS. 15A and 15B, backend process 390 includes forming an interlayer dielectric (ILD) 1510 and contact structures such as 1520 and 1530 coupled to the elevated source/drain regions. FIG. 15A is a simplified cross-sectional view diagram of dual-gate FinFET 1101 along the BB' direction of FIG. 11 according to an embodiment of the invention. FIG. 15B is a simplified cross-sectional view diagram of tri-gate FinFET 1102 along the CC' direction of FIG. 11 according to an embodiment of the invention. In some embodiments, the contact structures are tungsten plugs. Process 312 also includes forming interconnects using copper and low k dielectrics. In a preferred embodiment, tri-gate (single-gate) FinFETs and dual-gate FinFETs are formed on the same chip.

Figure 16:
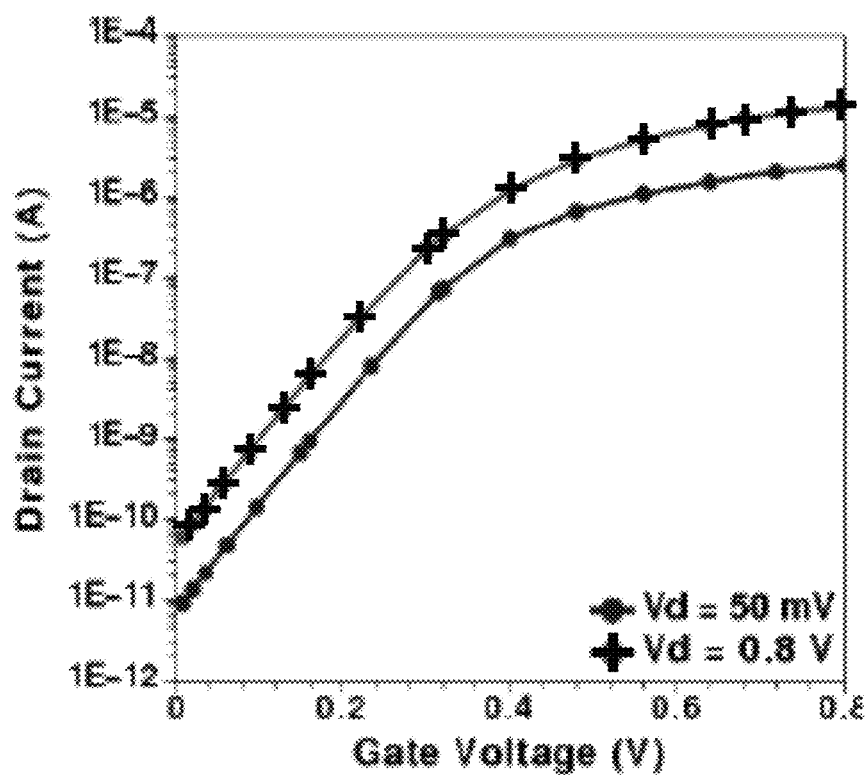
FIG. 16 is a simplified diagram of current voltage curves of a tri-gate FinFET according to an embodiment of the present invention.

FIG. 16 is a simplified diagram of simulated current voltage curves of a single-gate (tri-gate) FinFET device according to an embodiment of the present invention. This diagram is merely an example, which should not unduly limit the scope of the claims herein. One of ordinary skill in the art would recognize other variations, modifications, and alternatives. As shown, the simulated drain current of a 30 nm tri-gate FinFET device is plotted against gate voltage for drain biases of 0.8 V and 50 mV, respectively.

A method for operating an integrated circuit device according to an embodiment of the present invention may be outlined as follows:

1. providing an SOI substrate;
2. providing a first circuit region in the SOI substrate;
3. providing a second circuit region in the SOI substrate;
4. forming a tri-gate FinFET in the first circuit region, the tri-gate FinFET comprising a drain electrode, a source electrode, and a gate electrode;
5. forming a dual-gate FinFET in the second circuit region, the dual-gate FinFET comprising a drain electrode, a source electrode, and a first gate electrode a second gate electrode;
6. applying a first bias voltage and second bias voltage to the drain electrode and the source electrode of the tri-gate FinFET, respectively;
7. receiving a first signal at the gate electrode of the tri-gate FinFET;
8. applying a third bias voltage and fourth bias voltage to the drain electrode and the source electrode of the dual-gate FinFET, respectively; and
9. receiving a second signal and a third signal at the first gate electrode and the second gate electrode of the tri-gate FinFET, respectively.

In a specific embodiment, the tri-gate FinFET includes a channel region that is surrounded by the gate electrode on three sides. The dual-gate FinFET includes a channel region sandwiched between the first and second gate electrodes. In some embodiments, the first circuit region is an I/O region. In other embodiments, the second circuit region is a core logic region. In a specific embodiment, the third signal is a dynamic signal generated by another circuit. In some embodiments, the dual-gate FinFET is configured to be operated in a weak inversion region. Of course, there can be other variations, modifications, and alternatives.

The above sequence of processes provides a method for operating an integrated circuit including a dual-gate FinFET and a tri-gate FinFET according to an embodiment of the present invention. As shown, the method uses a combination of steps including a way of operating a dual gate FinFET and a single-gate FinFET on the same SOI substrate. For example, in some embodiments, an integrated circuit chip includes single-gate FinFETs in I/O circuits and dual-gate FinFETs in core logic circuits. Of course, there can be other variations, modifications, and alternatives. Other alternatives can also be provided where steps are added, one or more steps are removed, or one or more steps are provided in a different sequence without departing from the scope of the claims herein.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:
1. A method for fabricating an integrated circuit having at least a tri-gate FinFET and a dual-gate FinFET, the method comprising:
   providing a semiconductor on insulator (SOI) substrate, the SOI substrate comprising a semiconductor layer overlying an insulator layer, the semiconductor layer having a surface region;
   implanting impurities into the semiconductor layer for a threshold voltage adjustment;
   forming a hard mask overlying the surface region;
   patterning the hard mask to form a first hard mask cap portion and a second hard mask cap portion;
   etching the semiconductor layer using the patterned hard mask as an etch mask to form a first fin and a second fin and expose a contiguous surface of the insulator layer between the first and second fins;

removing the second hard mask cap portion overlying the second fin;

forming a gate dielectric layer over side surfaces of the first fin and side surfaces and a top surface of the second fin while leaving the first hard mask cap portion uncovered;

forming a conductive layer overlying the gate dielectric layer, the conductive layer in direct contact with the first hard mask cap portion and with the exposed contiguous surface of the insulator layer;

selectively etching the conductive layer using a photolithographic and etch process to form a first gate structure covering the first hard mask cap portion on the first fin and the side surfaces the first fin and a second gate structure covering the top surface and the side surfaces the second fin;

forming an interlayer dielectric layer overlying the first and second gate structures; and removing a top portion of the first and second gate structures by chemical mechanical polishing (CMP) using the first hard mask cap portion as a polish stop, such that the first gate structure is separated into a first gate electrode and a second gate electrode covering the side surfaces of the first fin to form the dual-gate FinFET, and the second gate structure covers the top surface and the side surfaces of the second fin to form the tri-gate FinFET.

2. The method of claim 1, wherein the insulator layer comprises silicon dioxide and the semiconductor layer comprises silicon.

3. The method of claim 1, wherein forming the conductive layer comprises an atomic layer deposition process.

4. The method of claim 1, wherein the first fin has a rectangular cross-section with a width in a range between about 5 nm and about 50 nm and a height in a range between about 5 nm and about 100 nm.

5. The method of claim 1, wherein the second fin has a rectangular cross-section with a width in a range between about 5 nm and about 50 nm and a height in a range between about 5 and about 100 nm.

6. The method of claim 1, wherein forming the first and second fins further comprising annealing in an $H_2$ ambient at a temperature ranging from about 800° C. to about 1000° C.

7. The method of claim 1, wherein selectively etching the conductive layer comprises:
providing an etch mask;
patterning the etch mask;
etching the conductive layer; and
removing the etch mask.

8. The method of claim 1 further comprising:
forming elevated source and drain regions; and
forming a SiGe layer on the elevated source and drain regions by selective epitaxial growth at a temperature of about 700-800° C. in an ambient of $SiH_2Cl_2+HCl+GeH_4$.

9. The method of claim 8, wherein the SiGe layer has a thickness of about 100 nm to about 500 nm and a germanium content of about 10-30%.

10. The method of claim 1 further comprising:
forming contact regions, the contact regions comprising tungsten plugs; and
forming interconnects, the interconnects comprising copper interconnect lines.

11. The method of claim 1, wherein the second gate structure contacts at least three surfaces of the second fin.

12. The method of claim 1, wherein the first gate structure comprises a first gate electrode and a second electrode, the first and second electrodes being disposed on opposite sides of the first fin and electrically insulated from each other.

13. The method of claim 1, wherein the first fin is disposed in a core region and the second fin is disposed in an input/output region.

14. The method of claim 1, wherein the hard mask is one of SiN, $SiO_2$, and SiON.

15. The method of claim 1, wherein the gate dielectric layer comprises one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, and $Y_2O_xN_y$, wherein x and y are integer.

16. The method of claim 1, wherein the conductive layer comprises one of W, Ta, TiN, ZrN, HfN, VN, NbN, TaN, WN, TiAlN, TaC, TaMgC, and TaCN.

17. The method of claim 1, wherein the tri-gate FinFET has a source/drain region disposed at a distal end of the first fin and the dual-gate FinFET has a source/drain region disposed at a distal end of the second fin.

18. The method of claim 17, wherein the source/drain region of the tri-gate FinFET comprises SiGe.

19. The method of claim 17, wherein the source/drain region of the dual-gate FinFET comprises SiGe.

20. The method of claim 1, wherein forming the gate dielectric layer comprises:
forming an oxide layer having a thickness in a range between about 0.1 nm and about 3 nm with in situ steam-generated (ISSG) or rapid thermal oxidation (RTO) at a temperature in a range between about 700° C. and about 900° C.;
submitting the oxide layer to a decoupled plasma nitridation (DPN) process in a nitrogen ambient to form a nitrided oxide layer; and
annealing the nitrided oxide layer.

* * * * *